(12) United States Patent
Orlet et al.

(10) Patent No.: US 8,987,594 B1
(45) Date of Patent: Mar. 24, 2015

(54) RECONFIGURABLE MULTIPLE INTERCONNECTION DEVICE AND METHOD

(71) Applicant: The Boeing Company, Chicago, IL (US)

(72) Inventors: James L. Orlet, St. Charles, MO (US); Gerald L. Murdock, St. Charles, MO (US); David J. Paddock, Westwood, MO (US)

(73) Assignee: The Boeing Company, Chicago, IL (US)

( * ) Notice: Subject to any disclaimer, the term of this patent is extended or adjusted under 35 U.S.C. 154(b) by 255 days.

(21) Appl. No.: 13/652,954

(22) Filed: Oct. 16, 2012

(51) Int. Cl.
*H02G 3/04* (2006.01)

(52) U.S. Cl.
USPC ....... 174/72 A; 174/68.1; 174/88 R; 174/135; 361/826; 385/135

(58) Field of Classification Search
USPC ............ 174/481, 68.1, 68.3, 135, 72 A, 73.1, 174/74 R, 88 R; 361/600, 601, 826, 827, 361/828; 439/488, 491, 489, 676, 540.1; 385/134, 135
See application file for complete search history.

(56) References Cited

U.S. PATENT DOCUMENTS

| | | | |
|---|---|---|---|
| 5,548,489 A | 8/1996 | Reed et al. | |
| 5,877,944 A | 3/1999 | Onizuka | |
| 5,921,508 A * | 7/1999 | Cobb | 174/135 |
| 6,078,507 A * | 6/2000 | Tronolone et al. | 361/827 |
| 6,531,657 B1 | 3/2003 | Jones, Jr. et al. | |
| 7,737,360 B2 * | 6/2010 | Wiemeyer et al. | 174/481 |
| 7,874,854 B2 * | 1/2011 | Cobb | 439/540.1 |
| 8,092,249 B2 * | 1/2012 | German et al. | 439/489 |
| 8,181,229 B2 * | 5/2012 | Macauley | 439/491 |
| 8,382,501 B2 * | 2/2013 | Tucker | 439/676 |

* cited by examiner

*Primary Examiner* — Angel R Estrada
(74) *Attorney, Agent, or Firm* — Hope Baldauff, LLC (57) ABSTRACT

The present disclosure is generally directed to a reconfigurable multiple interconnection device including a first electrical interface including a first plurality of electrical connecting points, at least one wiring harness including a plurality of electrical conductors where a first end of the plurality of electrical conductors being electrically connected to respective electrical connecting points of the first electrical interface, and where a second end of the plurality of electrical conductors being electrically connected to an interchangeable terminal. The device further includes a second electrical interface including a second plurality of electrical connecting points, the second electrical interface configured to receive the interchangeable terminal of the at least one wiring harness in at least a first position.

20 Claims, 10 Drawing Sheets

RECONFIGURABLE MULTIPLE INTERCONNECTION DEVICE AND METHOD

TECHNICAL FIELD

The field of the embodiments presented herein is directed toward a mass electrical interconnection apparatus able to be quickly reconfigured to accommodate various configurations of electrical testing equipment connected to the apparatus.

BACKGROUND

Various test equipment developers design different mass interconnection devices for each of their families of automatic test system equipment. Users of the test equipment create unique system mass interconnect device adapters in attempt to physically adapt to the connections of test hardware from one test system to another. These adapters are typically designed only as an afterthought for attached to exterior electrical mass interconnections of the test system. Thus, changing out these one of a kind mass interconnector is a labor and time intensive process. This typical type of approach treats the adapter as a non-integral part of the system design and compromises in both physical connectivity and electrical performance.

Existing mass interconnect adapters usually are attached to an exterior electrical interface portion of the automatic test system hardware. The weight and additional moment arm induce by these mass interconnect adapters cause reliability problems over time. Additionally, an exterior interconnect adapter changes the physical envelop of the automatic test system station and interferes with other items and activities in limit space environments.

There is a need for an interconnection device that allows the automatic test system to be rapidly reconfigured where the interconnection device act as an adapter having a physical, mechanical, and electrical performance of an integral device. It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a reconfigurable multiple interconnection device including a first electrical interface including a first plurality of electrical connecting points, at least one wiring harness including a plurality of electrical conductors. A first end of the plurality of electrical conductors is configured to be electrically connected to respective electrical connecting points of the first electrical interface, and a second end of the plurality of electrical conductors is configured to be electrically connected to an interchangeable terminal. A second electrical interface additionally includes a second plurality of electrical connecting points, where the second electrical interface configured to receive the interchangeable terminal of the at least one wiring harness in at least a first position.

In another embodiment disclosed herein, a reconfigurable multiple interconnection device includes a first horizontal electrical interface including a first array of electrical connecting points configured to connect to an automatic testing device. The device further includes a plurality of wiring harness each including a plurality of corresponding electrical conductors where first ends of the plurality of electrical conductors are configured to be electrically connected to respective electrical connecting points of the first electrical interface, and where second ends of the plurality of electrical conductors are configured to be electrically connected to interchangeable terminals for each wiring harness. A second vertical electrical interface includes a second plurality of electrical connecting points, the second electrical interface on a first side is configured to receive the interchangeable terminal of the at least one wiring harness in at least a first position, and on a second side is configured to connect to test device equipment.

In another embodiment disclosed herein, a method of connecting a reconfigurable multiple interconnection between an automatic test unit (ATU) and a test device interface of a test device includes detachably coupling the reconfigurable multiple interconnection at a first corresponding interface of the ATU, where the reconfigurable multiple interconnection includes a plurality of feed-through electrical connections. The feed-through electrical connections are configured to electrically connect to a plurality of corresponding ATU electrical connections. The method further includes orienting at least one wire harness terminal including a portion of the plurality of feed-through electrical connections to a first position in the reconfigurable multiple interconnection. The method further includes detachably coupling the reconfigurable multiple interconnection at a second corresponding interface to the test device equipment interface. Once all the connections are made after coupling, the method further conducts electrical signals through the plurality of feed-through electrical connections of the reconfigurable multiple interconnection between the ATU and the test device equipment. The method further orients at least one wire harness terminal to a second position in the reconfigurable multiple interconnection.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein.

DETAILED DESCRIPTION

The following detailed description is directed to a reconfigurable system interconnect that provides a rapidly reconfigurable mass interconnect for automatic test system electrical interfaces.

Figure 1:
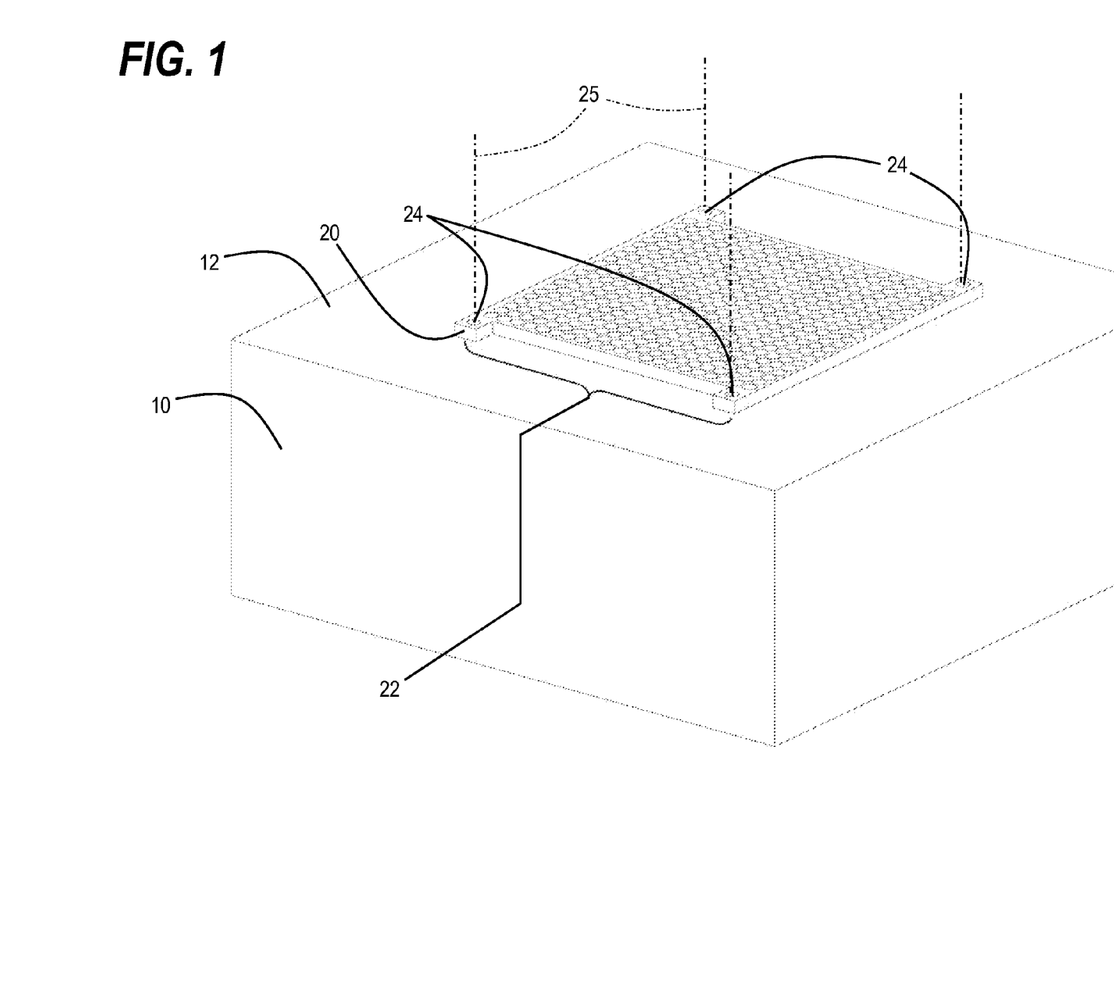
FIG. 1 illustrates an automatic test unit (ATU) including an ATU interface disposed on a top portion according to at least one embodiment disclosed herein.

FIG. 1 illustrates an automatic test unit 10 (ATU) including an ATU electrical interface 20 disposed on the ATU upper surface 12 according to at least one embodiment disclosed herein. The ATU 10 including plurality of conductor wire connections 22 that may be arranged in an array, (as shown), or a multiple arrays. These conductor wire connections 22 electrically connect to the internal components of the ATU 10 and may both receive and transmits electrical signals therethrough. The ATU 10 or the ATU electrical interface 20, (as shown), may include ATU or electrical interface detachable couplings 24 that are configured to allow for the detachable engagement of equipment to the ATU 10 as later described. The illustrated configuration of ATU or electrical interface detachable couplings 24 is merely representative of any type of mechanical or electro-mechanical coupling that allows for quick engagement and disengagement from the ATU 10. The ATU or electrical interface detachable couplings 24 ATU alignment/coupling axes 25 are illustrated in a vertical direction with respect to the ATU upper surface 12.

Figure 2:
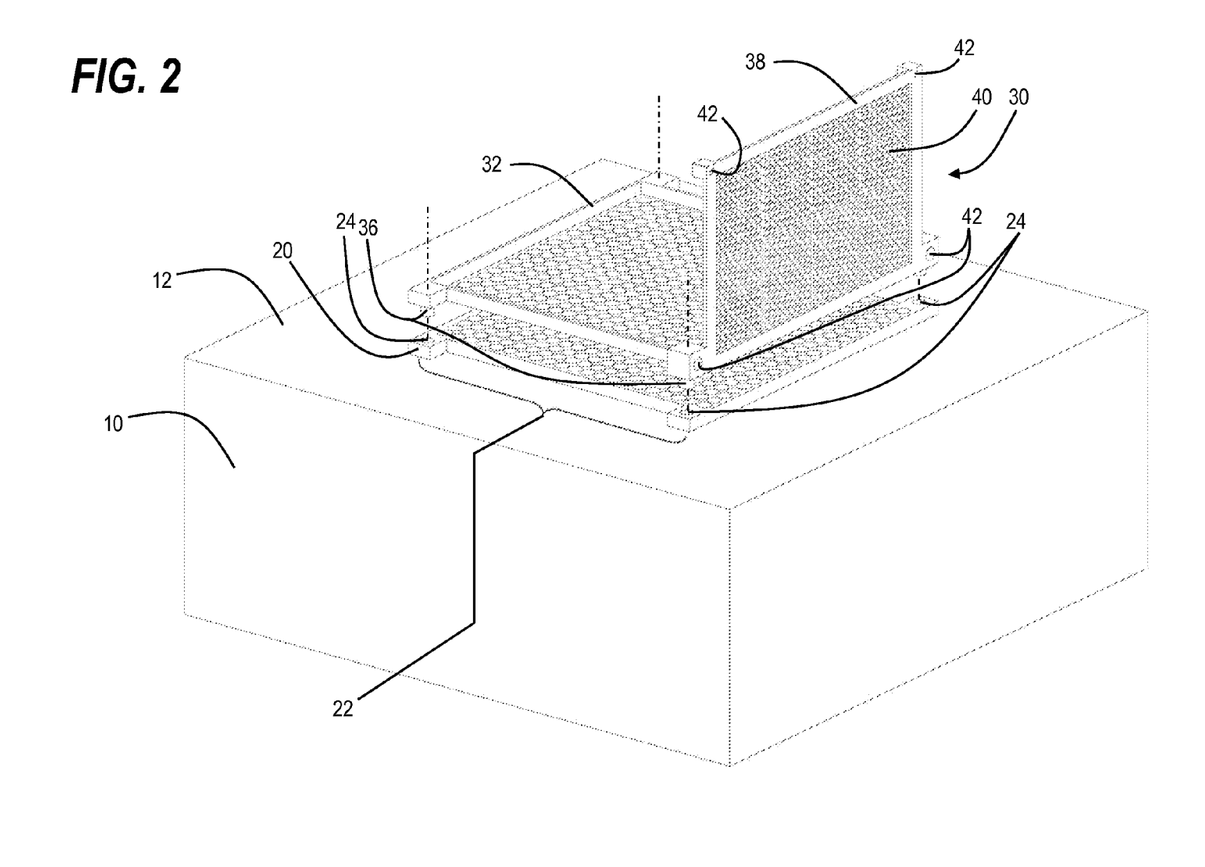
FIG. 2 illustrates the ATU and ATU interface of FIG. 1 and the reconfigurable multiple interconnection device in an aligned position with the ATU interface according to at least one embodiment disclosed herein.

FIG. 2 illustrates the ATU 10 and ATU upper surface 12 of FIG. 1 in addition to a reconfigurable multiple interconnection device 30 being aligned with the ATU alignment/coupling axes 25 of the ATU or electrical interface detachable couplings 24 according to at least one embodiment disclosed herein. The reconfigurable multiple interconnection device 30 includes a lower horizontal frame 32 that contains a first multiple point electrical interface 34 to bring all the connections from the ATU 10 conductor wire connections 22 into the reconfigurable multiple interconnection device 30. The first multiple point electrical interface 34 must be configured similarly to the ATU electrical interface 20 conductor wire connections 22 on one side for proper connection, but may have a different arrangement on the opposite or top side of the lower horizontal frame 32 of the reconfigurable multiple interconnection device 30. The reconfigurable multiple interconnection device 30 further includes detachable release fittings 36 at various positions around the lower horizontal frame 32 to mate with the ATU or electrical interface detachable couplings 24 of the ATU electrical interface 20. As mentioned above, the detachable release fittings 36, representatively illustrated herein, may be configured in any other manner to detachably engage and disengage the reconfigurable multiple interconnection device 30 from the ATU 10 via the lower horizontal frame 32. The reconfigurable multiple interconnection device 30 further includes an upper vertical frame 38 that provides support for joining reconfigurable electrical conductor terminals together at a second multiple point electrical interface 40. The upper vertical frame 38 further includes detachable couplings 42 for detachably engaging a test device equipment interface 60, (see FIG. 3).

Figure 3:
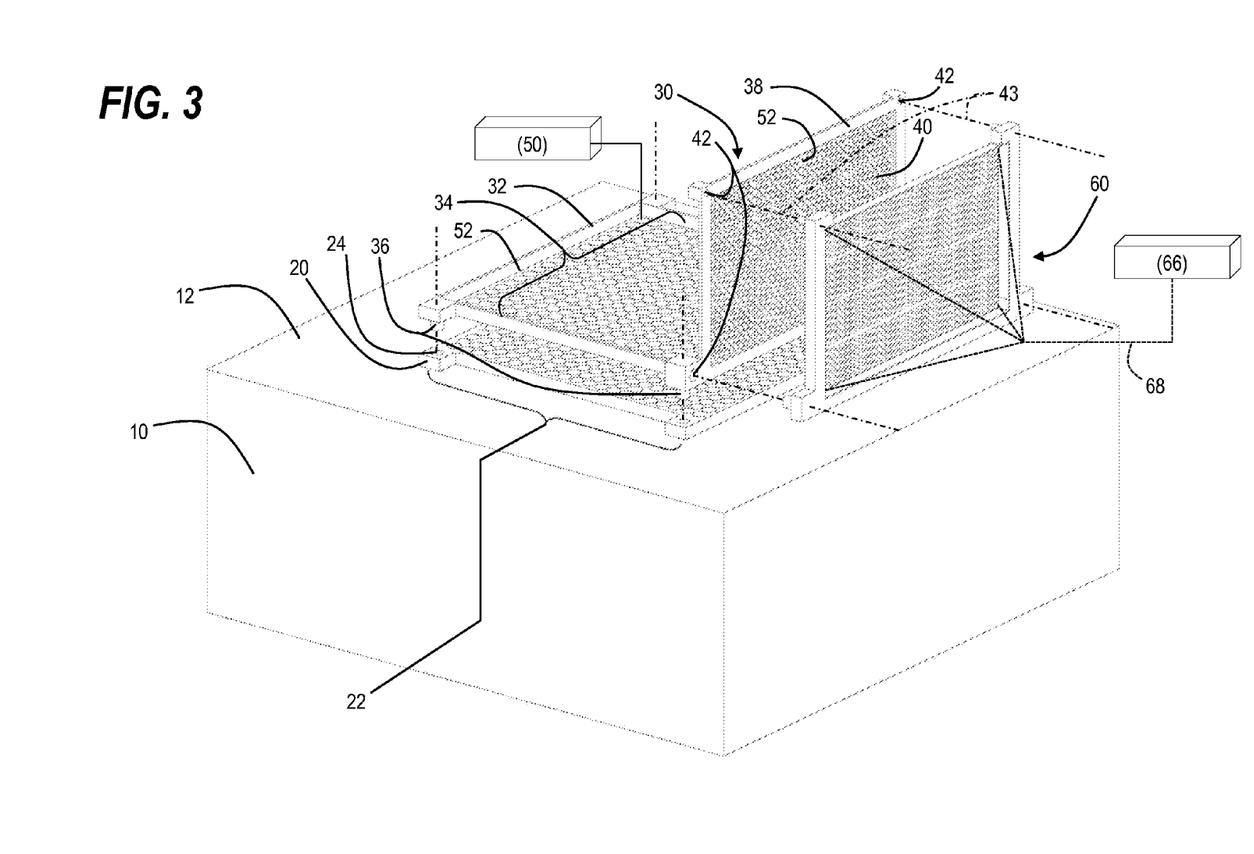
FIG. 3 illustrates the ATU, ATU interface and the reconfigurable multiple interconnection device of FIG. 2 at a test device equipment interface connected to test device equipment according to at least one embodiment disclosed herein.

FIG. 3 illustrates the ATU 10, the ATU electrical interface 20 and the reconfigurable multiple interconnection device 30 of FIG. 2 in addition to a test device equipment interface 60 that is detachably connected to test device equipment 66 according to at least one embodiment disclosed herein. FIG. 3 additionally illustrates a signal conditioning device 50 that is able to condition or process any signal travelling through the reconfigurable multiple interconnection device 30 to either the ATU 10 or the test device equipment 66. This allows for the transformation or conditioning of any single signal for combination of signals independent of the ATU 10 and the test device equipment 66. Further, a common grounding element 52 is included in the reconfigurable multiple interconnection device 30 that allows for any number of electrical conductors within the reconfigurable multiple interconnection device 30 to be associated to a common ground. All or a portion of the electrical conductors may be associated to a common ground. The common grounding element 52 may include electrical interconnections between all or portions of particular electrical connections. The common grounding element 52 may be limited to corresponding portions of particular groupings of electrical connections of subsystems within either the ATU 10 or the test device equipment 66.

Figure 6:
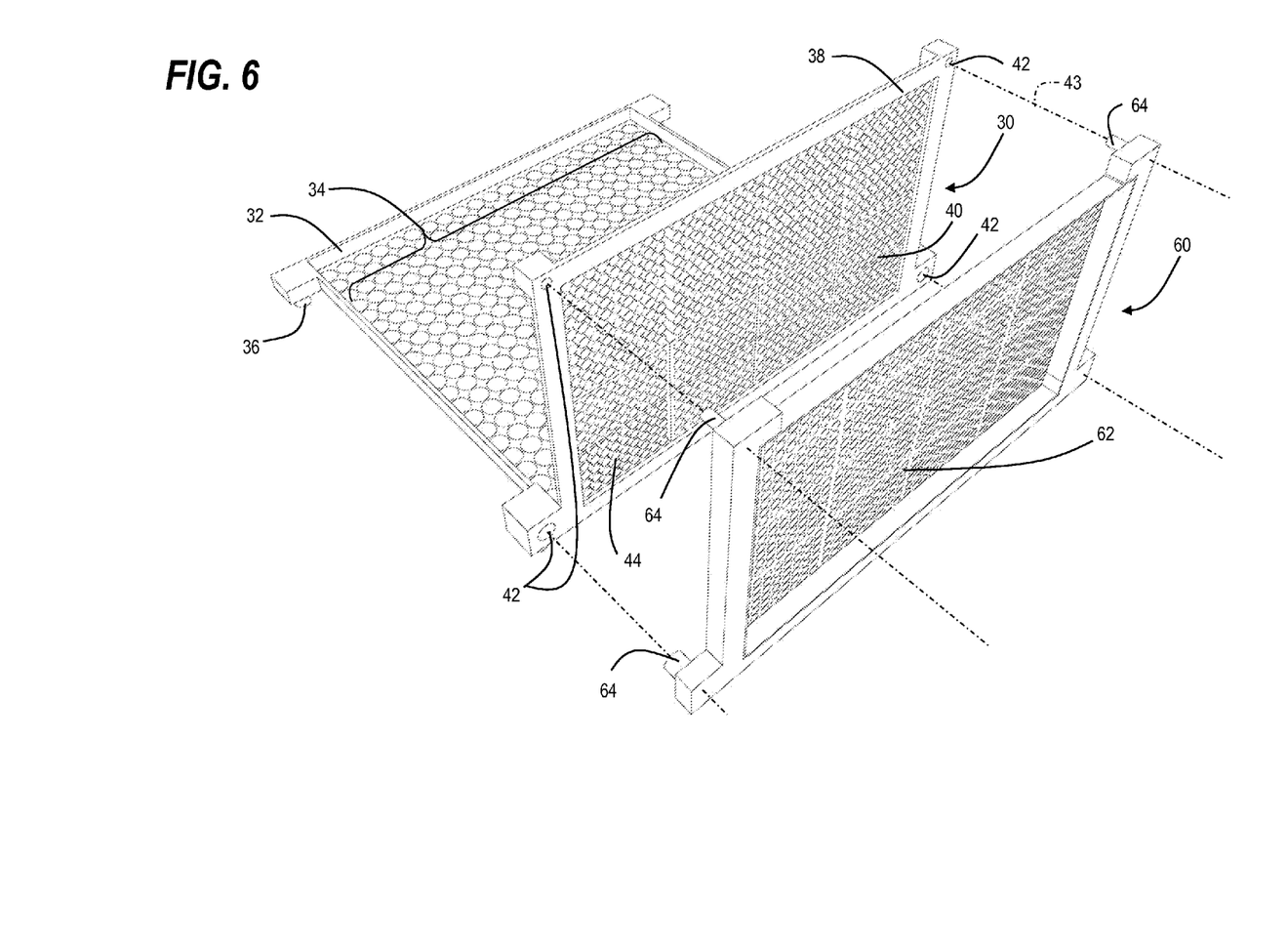
FIG. 6 illustrates a top perspective view the reconfigurable multiple interconnection device and the test device equipment interface of FIG. 3 according to at least one embodiment disclosed herein.

FIG. 3 additionally illustrates the detachable couplings 42 of the upper vertical frame 38 of the reconfigurable multiple interconnection device 30 being aligned with test device alignment/coupling axes 43 of the detachable release fittings 64, (shown in FIG. 6). The alignment of the test device equipment interface 60 with the detachable couplings 42 of the upper vertical frame 38 allow the test device equipment interface 60 to be electrically detachably engaged to the reconfigurable multiple interconnection device 30 in a similar manner as the reconfigurable multiple interconnection device 30 is detachably engaged with the ATU electrical interface 20. The test device equipment 66 is connected to the test device equipment interface 60 via multiple test device equipment connections 68 (not shown in detail, but illustrated in dashed line for simplicity).

Figure 4:
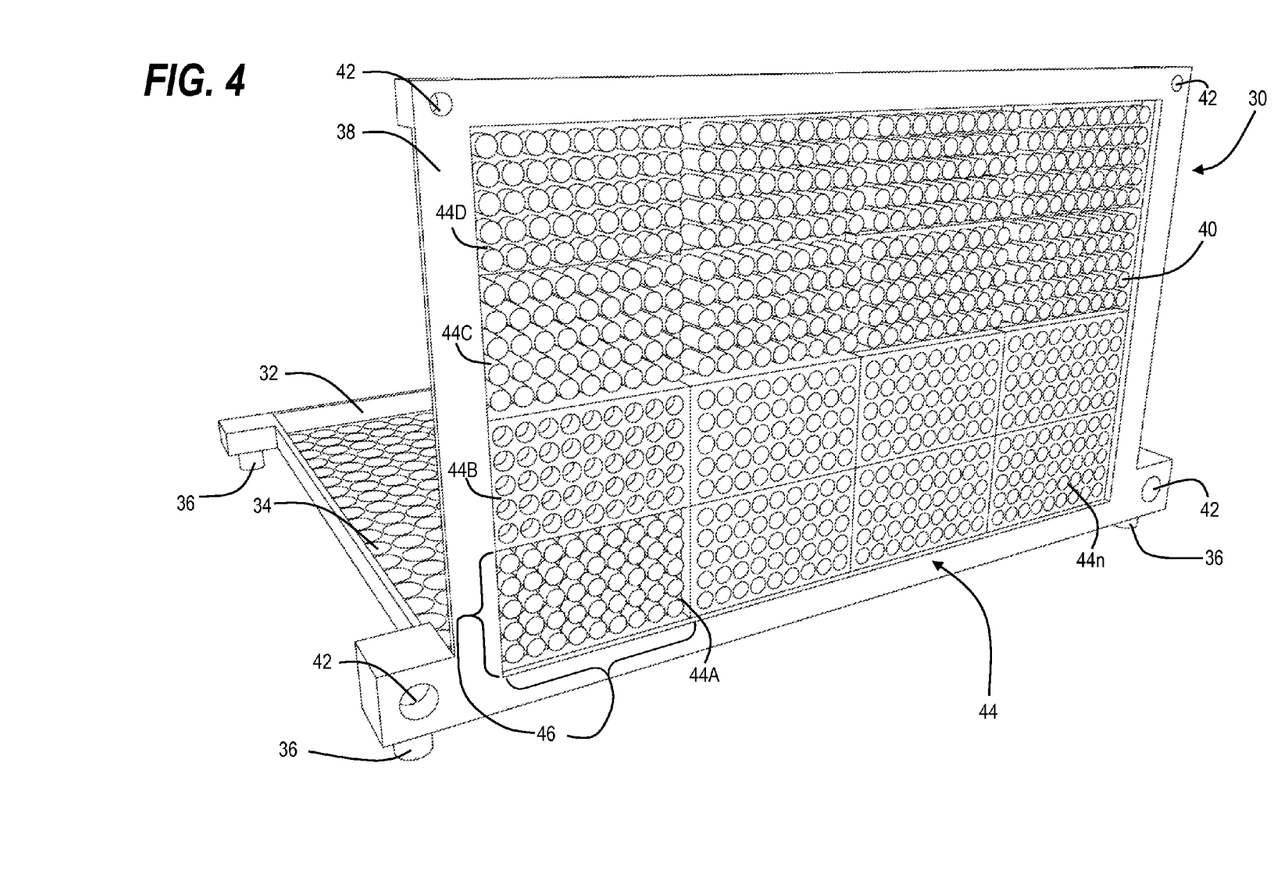
FIG. 4 illustrates a front view of the reconfigurable multiple interconnection device of FIGS. 2-3 according to at least one embodiment disclosed herein.

FIG. 4 illustrates a front view of the reconfigurable multiple interconnection device 30 of FIGS. 2-3 according to at least one embodiment disclosed herein, to further illustrate the interchangeable wire harness terminal blocks 44 connected to the upper vertical frame 38 of the reconfigurable multiple interconnection device 30. In this embodiment, there are illustrated 16 interchangeable wire harness terminal blocks 44 in multiple representative configurations. The interchangeable wire harness terminal block 44A illustrates a male conductor configuration of conductor pins, while interchangeable wire harness terminal block 44B illustrates a female conductor configuration of the conductor pins. The interchangeable wire harness terminal block 44C illustrates a male conductor configuration having a first conductor length, while interchangeable wire harness terminal block 44D illustrates a similar male conductor configuration having a second different, (e.g., shorter), length. These interchangeable wire harness terminal blocks 44 are representative in nature and may include various sizes, various conductor pin array 46 configurations and a different number of interchangeable wire harness terminal blocks 44 represented by interchangeable wire harness terminal block 44n. These interchangeable wire harness terminal blocks 44 may be rearranged, or particular ones may be eliminated within the upper vertical frame 38 of the reconfigurable multiple interconnection device 30 to allow for different interface configurations of test device equipment interface 60.

Figure 5:
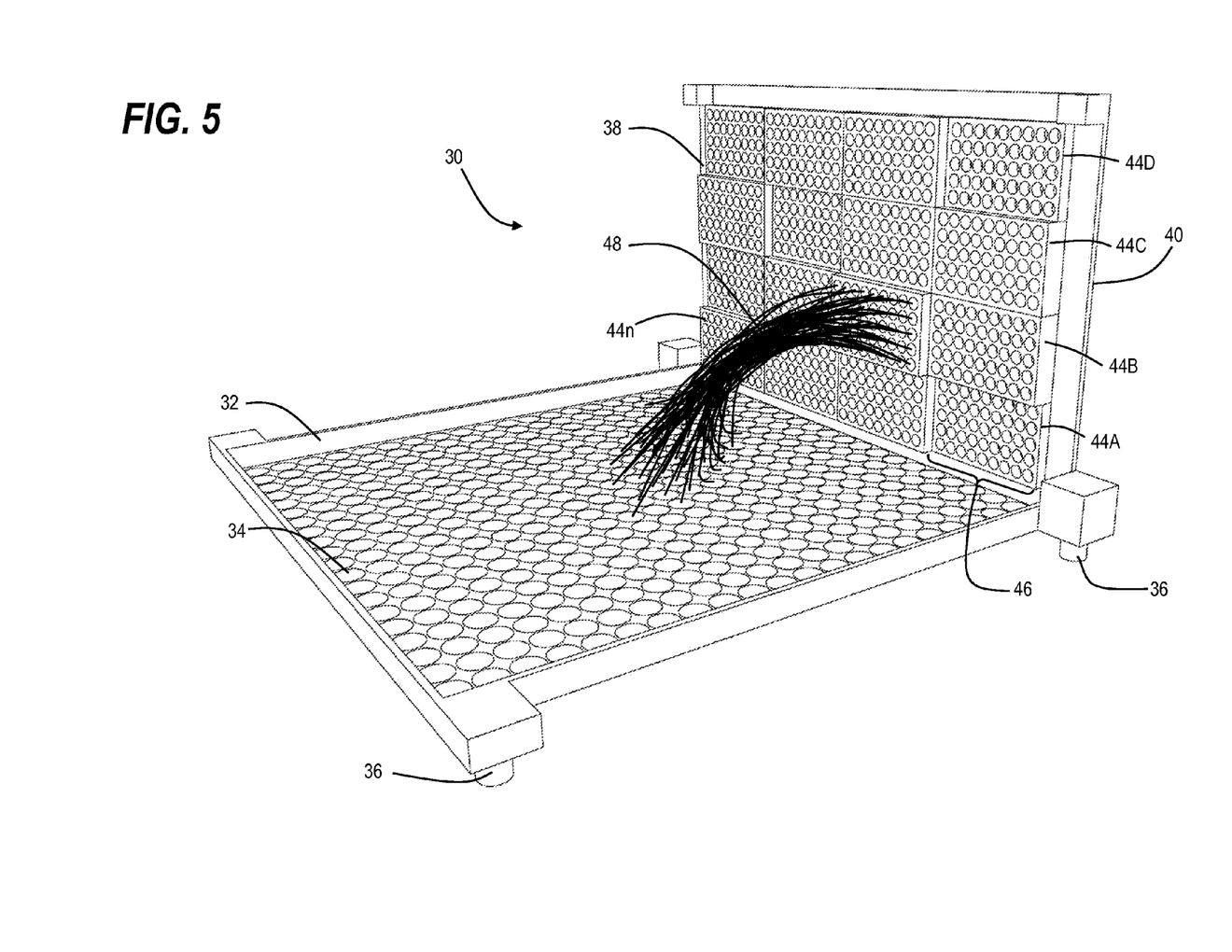
FIG. 5 illustrates a rear view of the reconfigurable multiple interconnection device of FIGS. 2-3 according to at least one embodiment disclosed herein.

FIG. 5 illustrates a rear view of the reconfigurable multiple interconnection device 30 of FIGS. 2-4 according to at least one embodiment disclosed herein where one (for simplified illustration purposes) wire harness terminal block is the terminal end to a wire harness 48 connected to particular conductor elements of the first multiple point electrical interface 34. However, each of the interchangeable wire harness terminal blocks 44 (44A-44n) may include a similarly configured connected wire harness 48 that is electrically connected to various particular conductor elements of the first multiple point electrical interface 34 of the lower horizontal frame 32. Each of the interchangeable wire harness terminal blocks 44, and each corresponding wire harness 48, may be disconnected from the upper vertical frame 38 and either moved to new location on the upper vertical frame 38 or not connected thereafter depending on the configuration of the test device equipment connection panel 62 of the test device equipment interface 60.

FIG. 6 illustrates a top perspective view the reconfigurable multiple interconnection device 30 and the test device equipment interface 60 of FIG. 3 according to at least one embodiment disclosed herein that includes a test device equipment connection panel 62 that electrically interfaces with the particular interchangeable wire harness terminal blocks 44 of the second multiple point electrical interface 40. From this figure, the detachable release fittings 64 of the test device equipment interface 60 are more clearly illustrated being aligned with the test device alignment/coupling axes 43 for detachable engagement with the detachable couplings 42 of the upper vertical frame 38.

Figure 7:
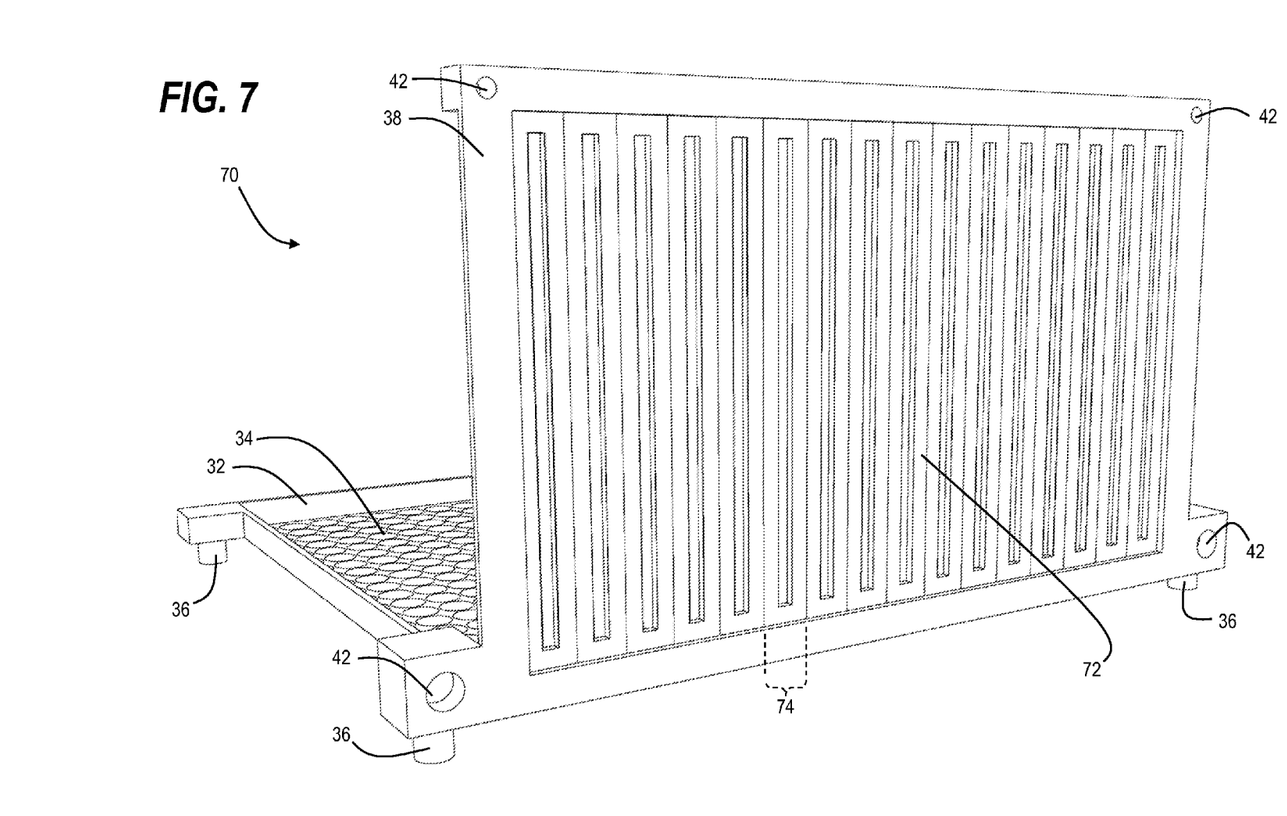
FIG. 7 illustrates a front perspective view of the reconfigurable multiple interconnection device according to at least one second embodiment disclosed herein.
Figure 8:
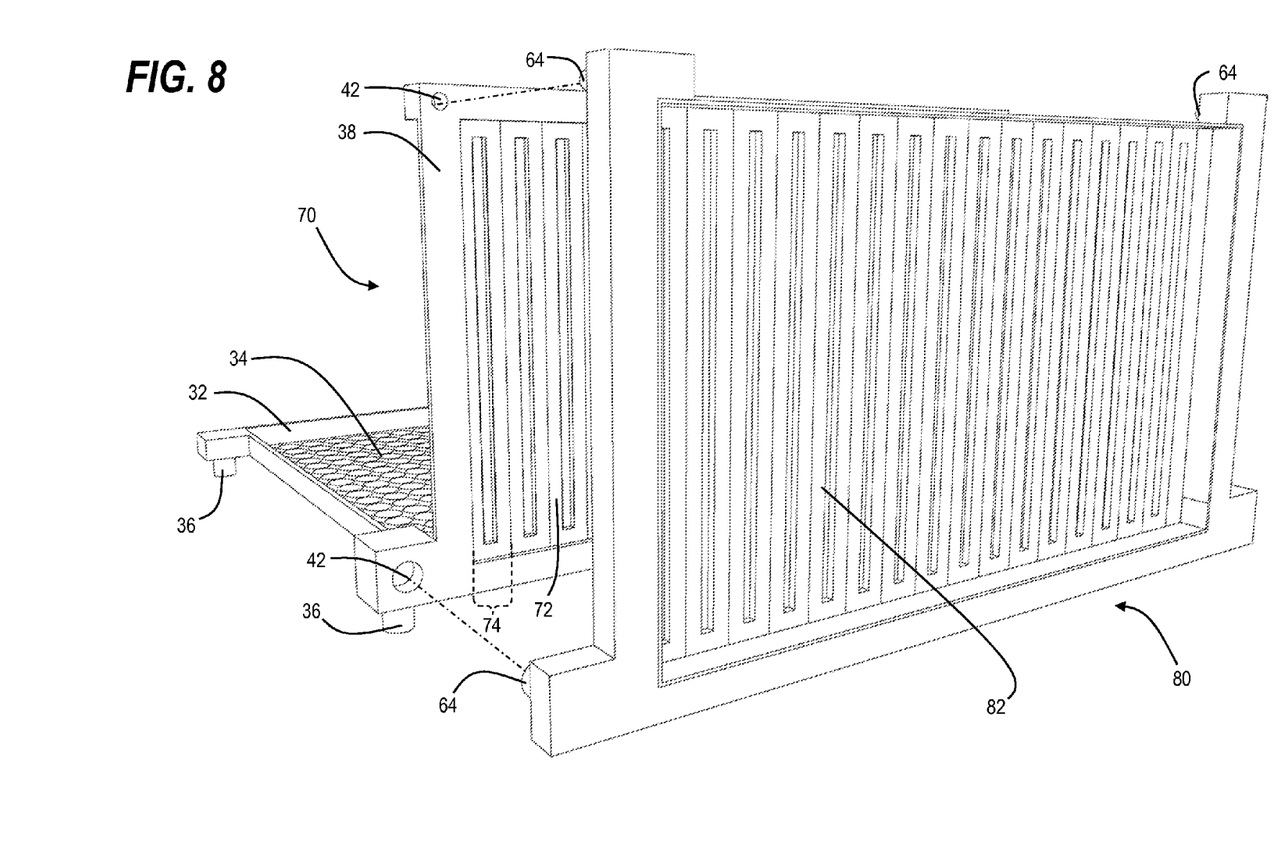
FIG. 8 illustrates a front perspective view of the reconfigurable multiple interconnection device and the test device equipment interface according to at least one second embodiment disclosed herein.

FIG. 7 illustrates a front perspective view of an alternate reconfigurable multiple interconnection device 70 according to at least one second embodiment disclosed herein, where an alternate second multiple point electrical interface 72 is configured in a multiple conductor bay or channel strip 74 layout. (The same reference numbers from FIGS. 1-6 will be used to correspond to those elements that are substantially unchanged between the first and second embodiments.) An alternate second multiple point electrical interface 72 may be arranged in vertical slot-like fashion to engage corresponding connections on a second test device equipment interface 80, as shown in FIG. 8 (illustrating a front perspective view of the alternate reconfigurable multiple interconnection device 70 and an second test device equipment interface 80 with a second test device equipment connection panel 82). The configuration of this second embodiment differs from the first embodiment of FIGS. 1-6 in that the alternate second multiple point electrical interface 72 includes a number of conductor bay or channel strip 74 that are independent from the terminals of the wire harnesses. This allows for each interchangeable wire harness terminal connector 76, see FIG. 9, to be independently connected to any particular conductor bay or channel strip 74, and in any particular position within a respective conductor bay or channel strip 74.

Figure 9:
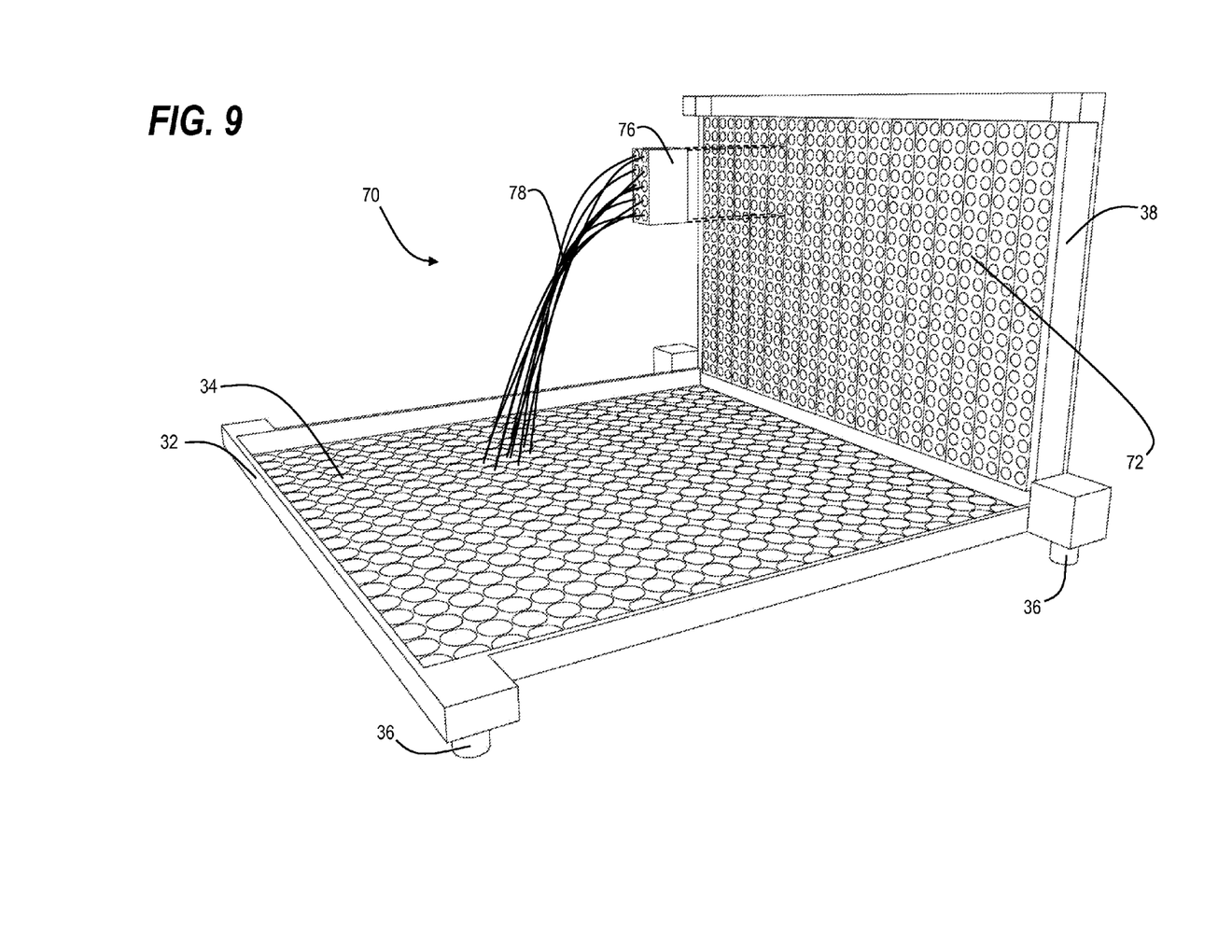
FIG. 9 illustrates a rear view of the reconfigurable multiple interconnection device of FIGS. 7-8 according to at least one second embodiment disclosed herein.

FIG. 9 illustrates a rear view of the alternate reconfigurable multiple interconnection device 70 of FIGS. 7-8 according to at least one second embodiment disclosed herein, where a interchangeable wire harness terminal connector 76 having a wire harness 78 connected to particular conductor points on the first multiple point electrical interface 34 may be electrically connected and reconnected to any portion of the alternate second multiple point electrical interface 72, i.e., any conductor bay or channel strip 74 and any portion alone each conductor bay or channel strip 74.

In summary, the reconfigurable multiple interconnection device 30 includes a first multiple point electrical interface 34 including a first plurality of electrical connecting points. At least one wire harness 48 includes a plurality of electrical conductors where a first end of the plurality of electrical conductors being electrically connected to respective electrical connecting points of the first multiple point electrical interface 34, and where a second end of the plurality of electrical conductors being electrically connected to an interchangeable wire harness terminal connector 76. The reconfigurable multiple interconnection device 30 further includes a second multiple point electrical interface 40 including a second plurality of electrical connecting points, the second multiple point electrical interface 40 may be configured to receive the interchangeable wire harness terminal connector 76 of the at least one wire harness 48 in at least a first position.

The second multiple point electrical interface 40 may be configured to receive the interchangeable wire harness terminal connector 76 of the at least one wire harness 48 in at least two positions.

A signal conditioning device 50 may be configured to electrically condition at least one electrical signal between the first multiple point electrical interface 34 and the second multiple point electrical interface 40. A common grounding element 52 may be configured to provide a common ground between at least two electrical conductors between the first multiple point electrical interface 34 and the second multiple point electrical interface 40.

A first ATU or electrical interface detachable coupling 24 proximate the first multiple point electrical interface 34 may be configured to releaseably join the reconfigurable multiple interconnection device 30 to ATU 10. A second detachable coupling 42 proximate the second multiple point electrical interface 40 may be configured to releaseably join the reconfigurable multiple interconnection device 30 to test device equipment interface 60.

A plurality of wire harnesses 48 may each include a plurality of electrical conductors, where a first end of each the plurality of electrical conductors may be electrically connected to respective electrical connecting points of the first multiple point electrical interface 34, and where each of the plurality of wire harnesses 48 may include interchangeable wire harness terminal connector 76 connected to second ends of the plurality of electrical conductors.

Each interchangeable wire harness terminal connector 76 of the plurality of wire harnesses 48 may be configured to be received in at least two different positions in the second multiple point electrical interface 40. Alternatively, the second plurality of electrical connecting points may be electrical conductors of the interchangeable wire harness terminal connector 76.

The alternate second multiple point electrical interface 72 may further include a conductor bay or channel strip 74, where a first of the conductor bay or channel strip 74 may be configured to receive a plurality of interchangeable wire harness terminal connectors 76 of corresponding wire harness 48, and where a second of the conductor bay or channel strip 74 may be configured to receive a corresponding test device equipment interface 60 of test device equipment 66.

The alternate second multiple point electrical interface 72 may further comprises a plurality of discrete conductor bay or channel strip 74, each discrete conductor bay or channel strip 74 may be configured to receive the interchangeable wire harness terminal connector 76 of corresponding wire harness 48 in at least two positions.

Figure 10:
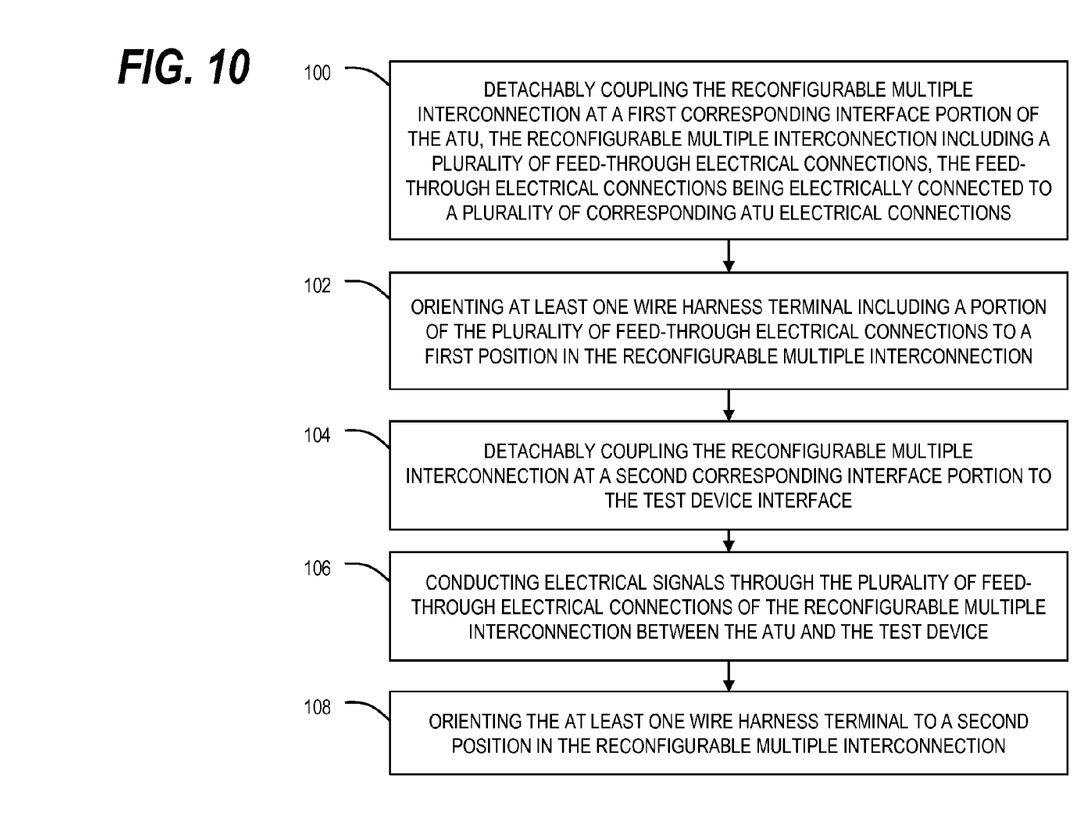
FIG. 10 illustrates a logic flowchart of a method of connecting a reconfigurable multiple interconnection between an automatic test unit (ATU) and a test device equipment interface of test device equipment.

FIG. 10 illustrates a logic flowchart of a method connecting a reconfigurable multiple interconnection between an automatic test unit (ATU) and a test device equipment interface of test device equipment. The method includes detachably coupling 100 the reconfigurable multiple interconnection at a first corresponding interface of the ATU, where the reconfigurable multiple interconnection includes a plurality of feed-through electrical connections, the feed-through electrical connections being electrically connected to a plurality of corresponding ATU electrical connections. The method further includes orienting 102 at least one wire harness terminal that includes a portion of the plurality of feed-through electrical connections to a first position in the reconfigurable multiple interconnection. The method further includes detachably coupling 104 the reconfigurable multiple interconnection at a second corresponding interface to the test device equipment interface. When both of these detachable couplings are performed, electrical signals may be conducted 106 through the plurality of feed-through electrical connections of the reconfigurable multiple interconnection between the ATU and the test device equipment. The method further includes orienting 108 the at least one wire harness terminal to a second position in the reconfigurable multiple interconnection.

While the electrical signals are being conducted through the reconfigurable multiple interconnection device 30 or alternate reconfigurable multiple interconnection device 70, the method further includes providing a signal conditioning device being electrically connected to at least one electrical connection of the reconfigurable multiple interconnection, and conditioning an electrical signal in the at least one electrical connection between the ATU and the test device equipment. The method may further comprise providing a common ground electrically connected to at least two feed-through electrical connections of the reconfigurable multiple interconnection, and grounding the at least two feed-through electrical connections between the ATU and the test device equipment.

Thus, the embodiments presented herein configure the reconfigurable multiple interconnection device as an integral and detachably reconfigurable part of the automatic test system that enhances both the physical connectivity and electrical performance of signals between the test device and automatic test system.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

The invention claimed is:

1. A reconfigurable multiple interconnection device comprising:
   a first electrical interface including a first plurality of electrical connecting points;
   at least one wiring harness including a plurality of electrical conductors
      where a first end of the plurality of electrical conductors being electrically connected to respective electrical connecting points of the first electrical interface, and
      where a second end of the plurality of electrical conductors being electrically connected to an interchangeable terminal; and
   a second electrical interface fixedly connected to said first electrical interface, the second electrical interface including a second plurality of electrical connecting points, the second electrical interface configured to receive the interchangeable terminal of the at least one wiring harness in at least a first position.

2. The reconfigurable multiple interconnection device according to claim 1, where the second electrical interface being configured to receive the interchangeable terminal of the at least one wiring harness in at least two positions.

3. The reconfigurable multiple interconnection device according to claim 1, further comprising:
   a signal conditioner configured to electrically condition at least one electrical signal between the first electrical interface and the second electrical interface.

4. The reconfigurable multiple interconnection device according to claim 1, further comprising:
   a common grounding element configured to provide a common ground between at least two electrical conductors between the first electrical interface and the second electrical interface.

5. The reconfigurable multiple interconnection device according to claim 1, further comprising:
   a first releaseable coupling proximate the first electrical interface configured to releaseably join the reconfigurable multiple interconnection device to automatic test equipment.

6. The reconfigurable multiple interconnection device according to claim 1, further comprising:
   a second releaseable coupling proximate the second electrical interface configured to releaseably join the reconfigurable multiple interconnection device to testing device equipment.

7. The reconfigurable multiple interconnection device according to claim 1, further comprising:
   a plurality of wiring harnesses each including a plurality of electrical conductors,
   where a first end of each the plurality of electrical conductors being electrically connected to respective electrical connecting points of the first electrical interface, and
   where each of the plurality of wiring harnesses includes an interchangeable terminal connected to second ends of the plurality of electrical conductors.

8. The reconfigurable multiple interconnection device according to claim 7, where each interchangeable terminal of the plurality of wiring harnesses is configured to be received in at least two different positions in the second electrical interface.

9. The reconfigurable multiple interconnection device according to claim 1, where the second plurality of electrical connecting points being electrical conductors of the interchangeable terminal.

10. The reconfigurable multiple interconnection device according to claim 1, the second electrical interface further comprises:
   a conductor bay, where a first portion of the conductor bay being configured to receive a plurality of interchangeable terminals of corresponding wiring harnesses, and
   where a second portion of the conductor bay being configured to receive a corresponding electrical connection of test device equipment.

11. The reconfigurable multiple interconnection device according to claim 10, where the conductor bay further comprises a plurality of discrete conductor bay channels, each discrete conductor bay channel configured to receive the interchangeable terminals of corresponding wiring harnesses in at least two positions.

12. A reconfigurable multiple interconnection device comprising:
- a first horizontal electrical interface including a first array of electrical connecting points configured to connect to an automatic testing device;
- a plurality of wiring harness each including a plurality of corresponding electrical conductors
  - where first ends of the plurality of electrical conductors being electrically connected to respective electrical connecting points of the first electrical interface, and
  - where second ends of the plurality of electrical conductors being electrically connected to interchangeable terminals for each wiring harness; and
- a second vertical electrical interface fixedly connected to said first horizontal electrical interface, the second vertical electrical interface including a second plurality of electrical connecting points, the second electrical interface on a first side configured to receive the interchangeable terminal of the at least one wiring harness in at least a first position, and on a second side configured to connect to test device equipment.

13. The reconfigurable multiple interconnection device according to claim 12, where the second electrical interface being configured to receive at least one interchangeable terminal of the plurality of wiring harness in at least two positions.

14. The reconfigurable multiple interconnection device according to claim 12, further comprising:
- a signal conditioner configured to electrically condition at least one electrical signal between the first electrical interface and the second electrical interface.

15. The reconfigurable multiple interconnection device according to claim 12, further comprising:
- a common grounding element configured to provide a common ground between at least two electrical conductors between the first electrical interface and the second electrical interface.

16. The reconfigurable multiple interconnection device according to claim 12, further comprising:
- a first releaseable coupling proximate the first electrical interface configured to releaseably join the reconfigurable multiple interconnection device to automatic test equipment; and
- a second releaseable coupling proximate the second electrical interface configured to releaseably join the reconfigurable multiple interconnection device to testing device equipment.

17. The reconfigurable multiple interconnection device according to claim 12, the second electrical interface further comprises:
- a conductor bay, where a first portion of the conductor bay being configured to receive the plurality of interchangeable terminals of corresponding wiring harnesses,
  - where a second portion of the conductor bay being configured to receive a corresponding electrical connection of test device equipment, and
  - where the conductor bay further comprises a plurality of discrete conductor bay channels, each discrete conductor bay channel configured to receive the interchangeable terminals of corresponding wiring harnesses in at least two positions.

18. A method of connecting a reconfigurable multiple interconnection between an automatic test unit (ATU) and a test device equipment interface of test device equipment, the method of connecting comprising:
- providing a first electrical interface including a first plurality of feed-through electrical connecting points and a second electrical interface fixedly connected to the first electrical interface, the second electrical interface including a second plurality of feed-through electrical connecting points;
- detachably coupling the first electrical interface at a first corresponding interface of the ATU, the first it, of feed-through electrical connections being electrically connected to a plurality of corresponding ATU electrical connections;
- orienting at least one wire harness terminal including a portion of the plurality of feed-through electrical connections to a first position in the second electrical interface;
- detachably coupling the second electrical interface at a second corresponding interface to the test device equipment interface, the second plurality of feed-through electrical connections being electrically connected to a plurality of corresponding electrical connections of the test device equipment;
- conducting electrical signals through the plurality of feed-through electrical connections between the ATU and the test device equipment; and
- orienting the at least one wire harness terminal to a second position in the second electrical interface.

19. The method according to claim 18, further comprising;
- providing a signal conditioning device electrically connected to at least one electrical connection of the reconfigurable multiple interconnection; and
- conditioning an electrical signal in the at least one electrical connection between the ATU and the test device equipment.

20. The method according to claim 18, further comprising;
- providing a common ground electrically connected to at least two feed-through electrical connections of the reconfigurable multiple interconnection; and
- grounding the at least two feed-through electrical connections between the ATU and the test device equipment.

* * * * *